(12) United States Patent
Yu et al.

(10) Patent No.: US 10,854,556 B2
(45) Date of Patent: Dec. 1, 2020

(54) SEMICONDUCTOR PACKAGE DEVICE AND METHOD OF MANUFACTURING THE SAME

(71) Applicant: Advanced Semiconductor Engineering Korea, Inc., Paju-Si (KR)

(72) Inventors: Kyungsic Yu, Paju-Si (KR); Yangwon Lee, Paju-Si (KR); Seokbong Kim, Paju-Si (KR)

(73) Assignee: ADVANCED SEMICONDUCTOR ENGINEERING KOREA, INC., Paju-si (KR)

( * ) Notice: Subject to any disclaimer, the term of this patent is extended or adjusted under 35 U.S.C. 154(b) by 242 days.

(21) Appl. No.: 15/291,658

(22) Filed: Oct. 12, 2016

(65) Prior Publication Data

US 2018/0102325 A1    Apr. 12, 2018

(51) Int. Cl.

| | |
|---|---|
| *H01L 23/552* | (2006.01) |
| *H01L 21/56* | (2006.01) |
| *H01L 21/48* | (2006.01) |
| *H01L 23/498* | (2006.01) |
| *H01L 23/31* | (2006.01) |
| *H01L 25/065* | (2006.01) |

(52) U.S. Cl.
CPC ........ *H01L 23/552* (2013.01); *H01L 21/4853* (2013.01); *H01L 21/56* (2013.01); *H01L 21/561* (2013.01); *H01L 23/49827* (2013.01); *H01L 23/49838* (2013.01); *H01L 23/3128* (2013.01); *H01L 23/49805* (2013.01); *H01L 23/49816* (2013.01); *H01L 25/0655* (2013.01); *H01L 2224/97* (2013.01); *H01L 2924/15311* (2013.01); *H01L 2924/181* (2013.01)

(58) Field of Classification Search
CPC ............... H01L 23/552; H01L 21/4853; H01L 23/49816; H01L 21/56
See application file for complete search history.

(56) References Cited

U.S. PATENT DOCUMENTS

| | | | |
|---|---|---|---|
| 5,355,016 A | 10/1994 | Swirbel et al. | |
| 5,557,142 A | 9/1996 | Gilmore et al. | |
| 6,578,755 B1 | 6/2003 | Elenius et al. | |
| 7,576,415 B2* | 8/2009 | Cha ........................ | H01L 23/29 |
| | | | 257/659 |
| 7,829,981 B2* | 11/2010 | Hsu ...................... | H01L 23/055 |
| | | | 257/660 |

(Continued)

*Primary Examiner* — Mohammed Shamsuzzaman
*Assistant Examiner* — Khatib A Rahman
(74) *Attorney, Agent, or Firm* — Foley & Lardner LLP

(57) ABSTRACT

A semiconductor package device includes a substrate, a die, a package body, a shielding layer, a solder mask layer, an insulating film and an interconnection element. The die is disposed on a top surface of the substrate. The package body is disposed on the top surface of the substrate to cover the die. The shielding layer is disposed on the package body and is electrically connected to a grounding element of the substrate. The solder mask layer is disposed on a bottom surface of the substrate. The insulating film is disposed on the solder mask layer. The interconnection element is disposed on the bottom surface of the substrate. A first portion of the interconnection element is covered by the insulating film, and a second portion of the interconnection element is exposed from the insulating film.

12 Claims, 17 Drawing Sheets

(56) References Cited

U.S. PATENT DOCUMENTS

| | | | |
|---|---|---|---|
| 7,989,928 B2* | 8/2011 | Liao | H01L 21/6835 |
| | | | 257/659 |
| 8,022,511 B2* | 9/2011 | Chiu | H01L 21/568 |
| | | | 257/659 |
| 8,368,185 B2* | 2/2013 | Lee | H01L 21/561 |
| | | | 257/659 |
| 8,576,574 B2 | 11/2013 | Wong et al. | |
| 9,748,167 B1* | 8/2017 | Lin | H01L 24/16 |
| 2004/0084205 A1* | 5/2004 | Chang | H01L 23/49822 |
| | | | 174/250 |
| 2004/0147664 A1* | 7/2004 | Lee | C08G 18/0823 |
| | | | 524/507 |
| 2007/0054212 A1* | 3/2007 | Akiyama | H01L 27/283 |
| | | | 430/132 |
| 2013/0028540 A1* | 1/2013 | Matsumoto | C09J 163/00 |
| | | | 383/107 |
| 2014/0117553 A1* | 5/2014 | Ha Woo | H01L 21/4853 |
| | | | 257/762 |
| 2016/0027666 A1* | 1/2016 | Rogers | H01L 21/76825 |
| | | | 438/127 |
| 2016/0268216 A1* | 9/2016 | Kim | H01L 24/97 |
| 2017/0098578 A1* | 4/2017 | Lee | H01L 24/03 |

* cited by examiner

SEMICONDUCTOR PACKAGE DEVICE AND METHOD OF MANUFACTURING THE SAME

BACKGROUND

1. Technical Field

The present disclosure relates to a semiconductor package device and a method of manufacturing the same, and more particularly to a semiconductor package device with a shielding layer and a manufacturing method thereof.

2. Description of the Related Art

Semiconductor devices have become progressively more complex, driven at least in part by the demand for enhanced processing speeds and smaller sizes. Enhanced processing speeds tend to involve higher clock speeds, which can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of the neighboring semiconductor device. This phenomenon is sometimes referred to as electromagnetic interference (EMI). Smaller sized semiconductor devices can exacerbate EMI by providing a higher density of semiconductor devices within an overall electronic system, and, thus, a higher level of undesired electromagnetic emissions at neighboring semiconductor devices.

One way to reduce EMI is to shield a set of semiconductor devices within a semiconductor package device. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package.

SUMMARY

In accordance with some embodiments of the present disclosure, a semiconductor package device comprises a substrate, a die, a package body, a shielding layer, a solder mask layer, an insulating film and an interconnection element. The substrate comprises a grounding element, a top surface, a bottom surface opposite to the top surface, and a lateral surface between the top surface and the bottom surface. The die is disposed on the top surface of the substrate. The package body is disposed on the top surface of the substrate to cover the die. The shielding layer is disposed on the package body and is electrically connected to the grounding element of the substrate. The solder mask layer is disposed on the bottom surface of the substrate. The insulating film is disposed on the solder mask layer. The interconnection element is disposed on the bottom surface of the substrate. A first portion of the interconnection element is covered by the insulating film, and a second portion of the interconnection element is exposed from the insulating film.

In accordance with some embodiments of the present disclosure, a method of manufacturing a semiconductor package device comprises: providing a substrate comprising a grounding element; disposing a die on a top surface of the substrate; forming a package body on the top surface of the substrate to cover the die; forming an interconnection element on a bottom surface of the substrate; forming an insulating film on the bottom surface of the substrate and the interconnection element, wherein the insulating film covers the interconnection element and is conformal to the interconnection element; forming a shielding layer on an external surface of the package body and a lateral surface of the substrate; and removing at least a portion of the insulating film. The shielding layer is connected to the grounding element.

In accordance with some embodiments of the present disclosure, a method of manufacturing a semiconductor package device comprises: providing a substrate comprising a grounding element; disposing a die on a top surface of the substrate; forming a package body on the top surface of the substrate to cover the die; forming an interconnection element on a bottom surface of the substrate; disposing a first insulating film on the bottom surface of the substrate, wherein the first insulating film covers a first portion of the interconnection element and exposes a second portion of the interconnection element; forming a second insulating film on the first insulating film and the second portion of the interconnection element, wherein the second insulating film is conformal to the interconnection element; forming a shielding layer on an external surface of the package body and a lateral surface of the substrate, wherein the shielding layer is connected to the grounding element; and removing the second insulating film.

Figure 1:
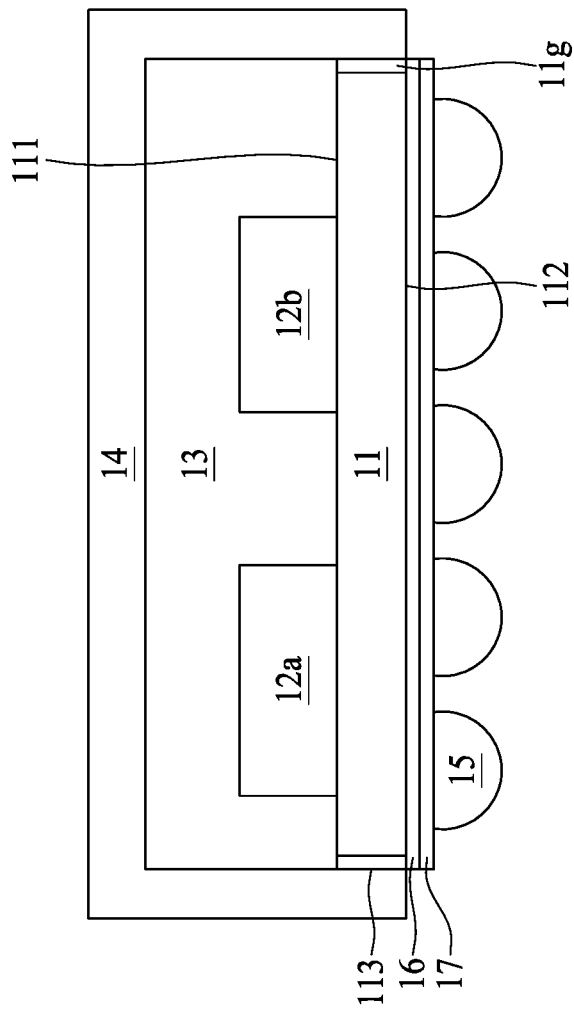
FIG. 1 illustrates a cross-sectional view of a semiconductor package device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

FIG. 1 illustrates a cross-sectional view of a semiconductor package device 1 in accordance with some embodiments of the present disclosure. The semiconductor package device 1 includes a substrate 11, electrical components 12a, 12b, a package body 13, a shielding layer 14, interconnection elements 15, a dielectric layer 16 and an insulating film 17.

The substrate 11 may be, for example, a printed circuit board, such as a paper-based copper foil laminate, a composite copper foil laminate, or a polymer-impregnated glass-fiber-based copper foil laminate. The substrate 11 may include an interconnection structure, such as a redistribution layer (RDL) or a grounding element 11g. In some embodiments, the grounding element 11g is a via exposed from a lateral surface 113 of the substrate 11. In some embodiments, the grounding element 11g is a metal layer exposed from the lateral surface 113 of the substrate 11. In some embodiments, the grounding element 11g is a metal trace exposed from the lateral surface 113 of the substrate 11.

The electrical components 12a, 12b are disposed on a top surface 111 of the substrate 11. The electrical component 12a may be an active component, such as an integrated circuit (IC) chip or a die. The electrical component 12b may be a passive electrical component, such as a capacitor, a resistor or an inductor. Each electrical component 12a, 12b may be electrically connected to one or more of another electrical component 12a, 12b and to the substrate 11 (e.g., to the RDL), and electrical connection may be attained by way of flip-chip or wire-bond techniques.

The package body 13 is disposed on the top surface 111 of the substrate 11 and encapsulates a part of the top surface 111 of the substrate 11 and the electrical components 12a, 12b. In some embodiments, the package body 13 includes an epoxy resin having fillers dispersed therein.

The shielding layer 14 is disposed on an external surface of the package body 13 and covers the package body 13, electrical components 12a, 12b and lateral surfaces 113 of the substrate 11. The shielding layer 14 is electrically connected to the grounding element 11g of the substrate 11. In some embodiments, the shielding layer 14 directly contacts the grounding element 11g of the substrate 11. In some embodiments, the shielding layer 14 is a conformal shield. The shielding layer 14 is aligned with a bottom surface 112 of the substrate 11; for example, a bottom of the shielding layer 14 is substantially coplanar with the bottom surface 112 of the substrate. In some embodiments, the shielding layer 14 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The shielding layer 14 may include a single conductive layer or multiple conductive layers. In some embodiments, the shielding layer 14 includes multiple conductive layers, and the multiple conductive layers may include a same material, or ones of the multiple conductive layers may include different materials, or each of the multiple conductive layers may include different materials from others of the multiple conductive layers. In some embodiments, each conductive layer of the shielding layer 14 has a thickness of up to about 200 micrometers (μm), such as up to about 150 μm, up to about 100 μm, up to about 50 μm, up to about 10 μm, up to about 5 μm, up to about 1 μm, or up to about 500 nanometers (nm), and down to about 100 nm or less, down to about 50 nm or less, or down to about 10 nm or less. In some embodiments, the shielding layer 14 includes multiple conductive layers, and different conductive layers may have different thicknesses.

The interconnection elements 15 are disposed on the bottom surface 112 of the substrate 11. In some embodiments, the interconnection elements 15 may be, for example, solder balls or conductive pads. The interconnection elements 15 provide input and output electrical connections for the semiconductor package device 1. In some embodiments, one or more of the interconnection elements 15 are electrically connected to the electrical components 12a, 12b by way of the interconnection structure included in the substrate 11. In some embodiments, at least one interconnection element 15 is a ground electrical interconnection element and is electrically connected to the grounding element 11g through the interconnection structure included in the substrate 11.

The dielectric layer 16 is disposed on the bottom surface 112 of the substrate 11. The dielectric layer 16 may be a solder mask layer, although other dielectric materials having adequate insulation ability may also be used. A side surface of the dielectric layer 16 is aligned with the lateral surface 113 of the substrate 11; for example, the side surface of the dielectric layer 16 is substantially coplanar with the lateral surface 113 of the substrate 11.

The insulating film 17 is disposed on the dielectric layer 16. The insulating film 17 covers a first portion of each of the interconnection elements 15 and exposes a second portion of each of the interconnection elements 15. That is, the insulating film 17 covers a part of a side portion of each of the interconnection elements 15 and exposes a bottom portion of each of the interconnection elements 15. A side surface of the insulating film 17 is aligned with the lateral surface 113 of the substrate 11 and the side surface of the dielectric layer 16; for example, the side surface of the insulating film 17 is substantially coplanar with the lateral surface 113 of the substrate 11 and the side surface of the dielectric layer 16. As depicted in FIG. 1, the side surface of the dielectric layer 16 and the side surface of the insulating film 17 are exposed from the shielding layer 14. In some embodiments, top and bottom surfaces of the insulating film 17 are substantially planar. In other words, a thickness of the insulating film 17 is substantially uniform. In some embodiments, the insulating film 17 extends continuously on the dielectric layer 16, so that a portion of the insulating film 17 covering one interconnection element 15 is connected to another portion of the insulating film 17 covering another interconnection element 15. In some embodiments, the insulating film 17 is selected from, or formed from, a thermal curing material (e.g., a thermal curing resin) or an optically sensitive material (e.g., an ultraviolet (UV) curing resin).

Since the insulating film 17 is formed over the bottom surface 112 of the substrate 11 and covers parts of the interconnection elements 15, the insulating film 17 can release a stress on the substrate 11, which can, in turn, improve a solder joint reliability of the interconnection elements 15 to an underlying package device carrier. In addition, the insulating film 17 disposed over the bottom surface 112 of the substrate 11 can operate together with the shielding layer 14 to further improve the effectiveness of EMI shielding, for example, with respect to electromagnetic emissions through a bottom of the semiconductor package device 1 or by preventing an undesired short circuit between the interconnection elements 15 and the shielding layer 14.

Figure 2:
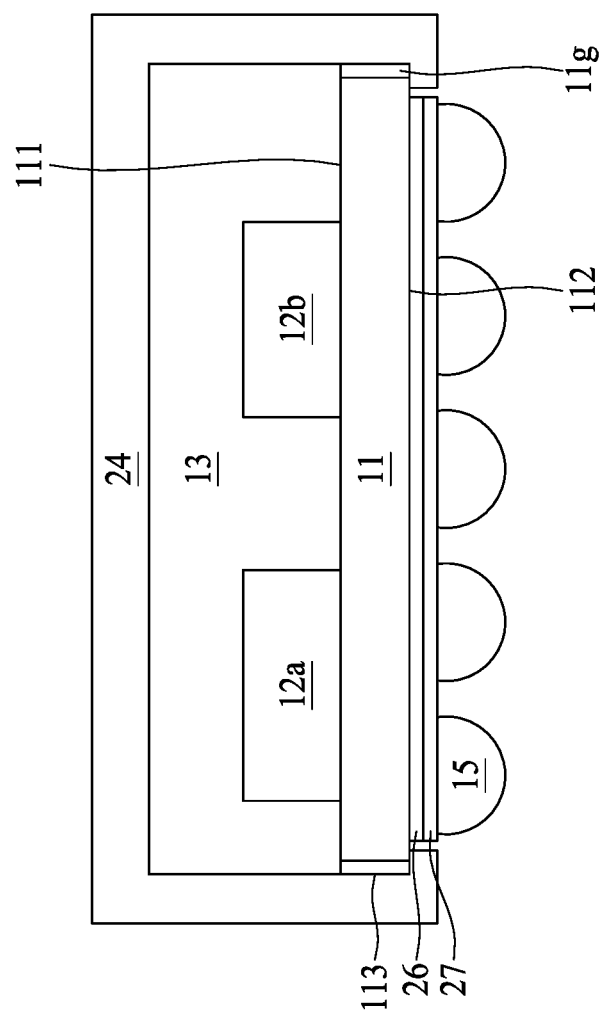
FIG. 2 illustrates a cross-sectional view of a semiconductor package device in accordance with some embodiments of the present disclosure.

FIG. 2 illustrates a cross-sectional view of a semiconductor package device 2 in accordance with some embodiments of the present disclosure. The semiconductor package device 2 is similar to the semiconductor package device 1 shown in FIG. 1, with a difference being that side surfaces of a dielectric layer 26 and an insulating film 27 are not aligned with the lateral surface 113 of the substrate 11. In other words, a space is formed between the side surface of the dielectric layer 26 and the lateral surface 113 of the substrate 11, and between the side surface of the insulating film 27 and the lateral surface 113 of the substrate 11, and the side surfaces of the dielectric layer 26 and the insulating film 27 are inwardly recessed relative to the lateral surface 113 of the substrate 11. In some embodiments, the side surface of the dielectric layer 26 is aligned with the side surface of the insulating film 27; for example, the side surface of the dielectric layer 26 is substantially coplanar with the side surface of the insulating film 27.

As illustrated in FIG. 2, a portion of a shielding layer 24 extends on a portion of the bottom surface 112 of the substrate 11, but does not contact the interconnection elements 15. In other words, the shielding layer 24 is electrically isolated from the interconnection elements 15 by the insulating film 27, with a gap between the shielding layer 24 and the insulating film 27 (although the gap can be omitted in other embodiments). Since a portion of the shielding layer 24 is formed on the bottom surface 112 of the substrate 11 to protect the interconnection elements 15 from EMI, the effectiveness of EMI shielding is further enhanced.

FIGS. 3A-3E illustrate a semiconductor manufacturing method in accordance with some embodiments of the present disclosure.

Figure 3A:
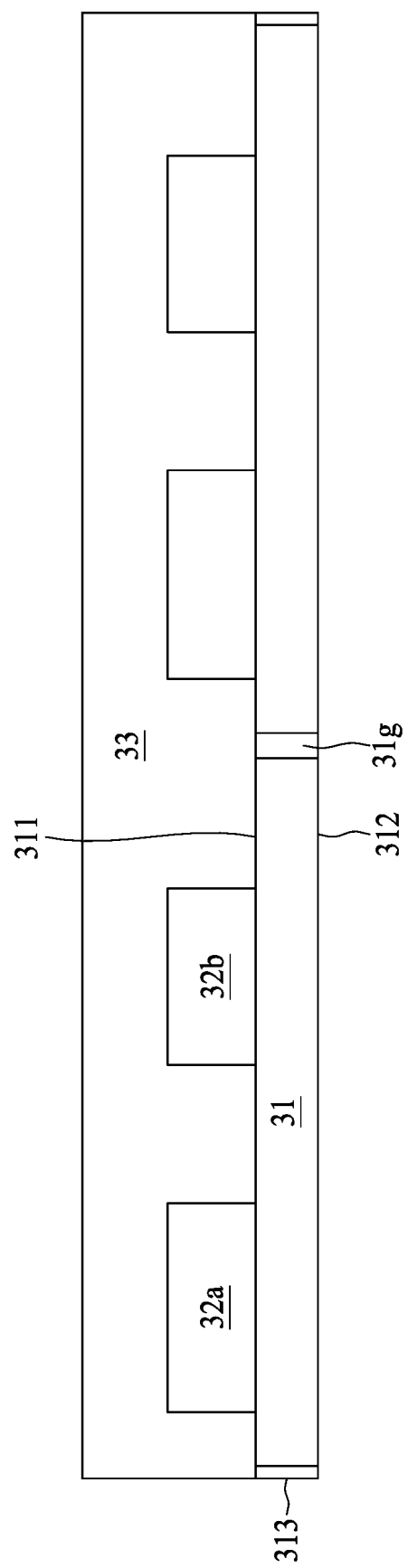
FIG. 3A, FIG. 3B, FIG. 3C, FIG. 3D and FIG. 3E illustrate a manufacturing method in accordance with some embodiments of the present disclosure.

Referring to FIG. 3A, a substrate strip including multiple substrates 31 is provided, and the provision of the multiple substrates 31 allows multiple semiconductor package devices to be manufactured concurrently. The substrate 31 may be, for example, a printed circuit board, such as a paper-based copper foil laminate, a composite copper foil laminate, or a polymer-impregnated glass-fiber-based copper foil laminate. The substrate 31 may include an interconnection structure, such as a RDL or a grounding element 31g. In some embodiments, the grounding element 31g is a via to be subsequently exposed from a lateral surface 313 of the substrate 31. In some embodiments, the grounding element 31g is a metal layer to be subsequently exposed from the lateral surface 313 of the substrate 31. In some embodiments, the grounding element 31g is a metal trace to be subsequently exposed from the lateral surface 313 of the substrate 31.

Electrical components 32a, 32b are mounted on a top surface 311 of each substrate 31. The electrical component 32a may be an active component, such as an IC chip or a die. The electrical component 32b may be a passive electrical component, such as a capacitor, a resistor or an inductor. Each electrical component 32a, 32b may be electrically connected to one or more of another electrical component 32a, 32b and to the substrate 31 (e.g., to the RDL), and electrical connection may be attained by way of flip-chip or wire-bond techniques.

A package body 33 is formed on the top surface 311 of each substrate 31 to encapsulate a part of the top surface 311 of the substrate 31 and the electrical components 32a, 32b. In some embodiments, the package body 33 includes an epoxy resin having fillers dispersed therein. The package body 33 may be formed by a molding technique, such as transfer molding or compression molding.

Figure 3B:
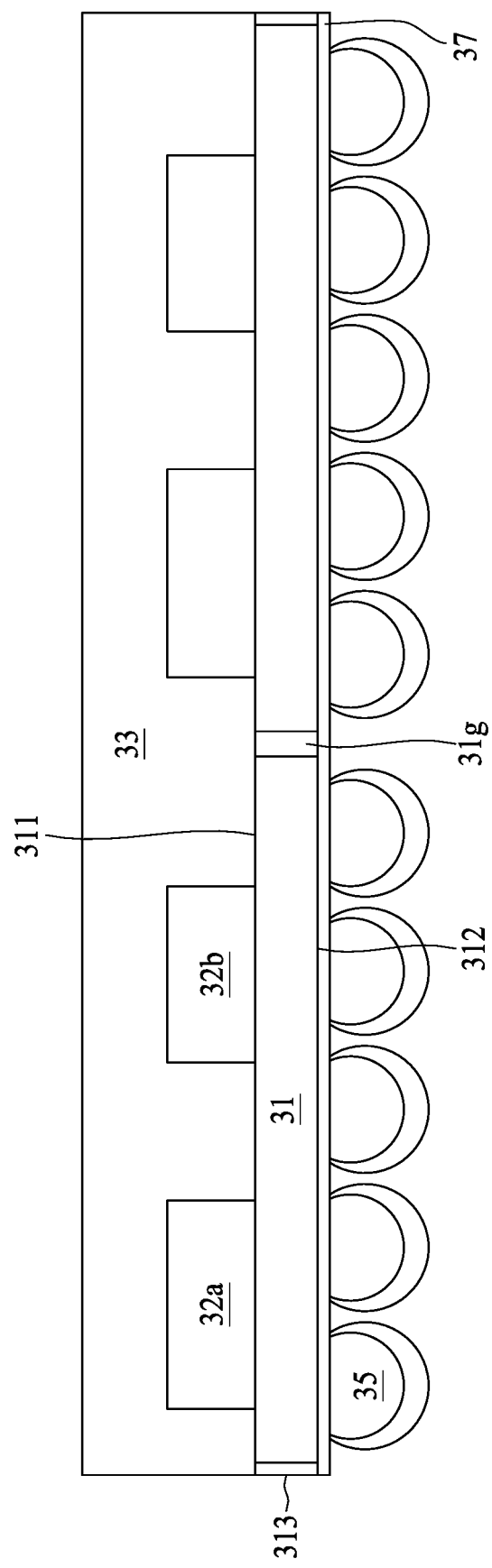

Referring to FIG. 3B, multiple interconnection elements 35 are formed on a bottom surface 312 of each substrate 31. In some embodiments, the interconnection elements 35 may be, for example, solder balls or conductive pads. The interconnection elements 35 provide input and output electrical connections for a resulting semiconductor package device. In some embodiments, one or more of the interconnection elements 35 are electrically connected to the electrical components 32a, 32b by way of the interconnection structure included in the substrate 31. In some embodiments, at least one interconnection element 35 is a ground electrical interconnection element and is electrically connected to the grounding element 31g through the interconnection structure included in the substrate 31.

An insulating film 37 is formed on the bottom surface 312 of each substrate 31 to substantially fully cover the bottom surface 312 of the substrate 31 and the interconnection elements 35. In other words, the insulating film 37 is conformal to the interconnection elements 35. In some embodiments, the insulating film 37 is formed by the following operations: (a) mixing a diluent and an insulating ink to form a material of the insulating film 37; (b) coating the material of the insulating film 37 on the bottom surface 312 of the substrate 31 and the interconnection elements 35; and (c) curing the material to form the insulating film 37. In operation (b), the coating can be accomplished by spraying. In some embodiments, the insulating film 37 is selected from, or formed from, a thermal curing resin or an UV curing resin, and, in operation (c), the curing can be accomplished by thermal curing or UV curing.

Figure 3C:
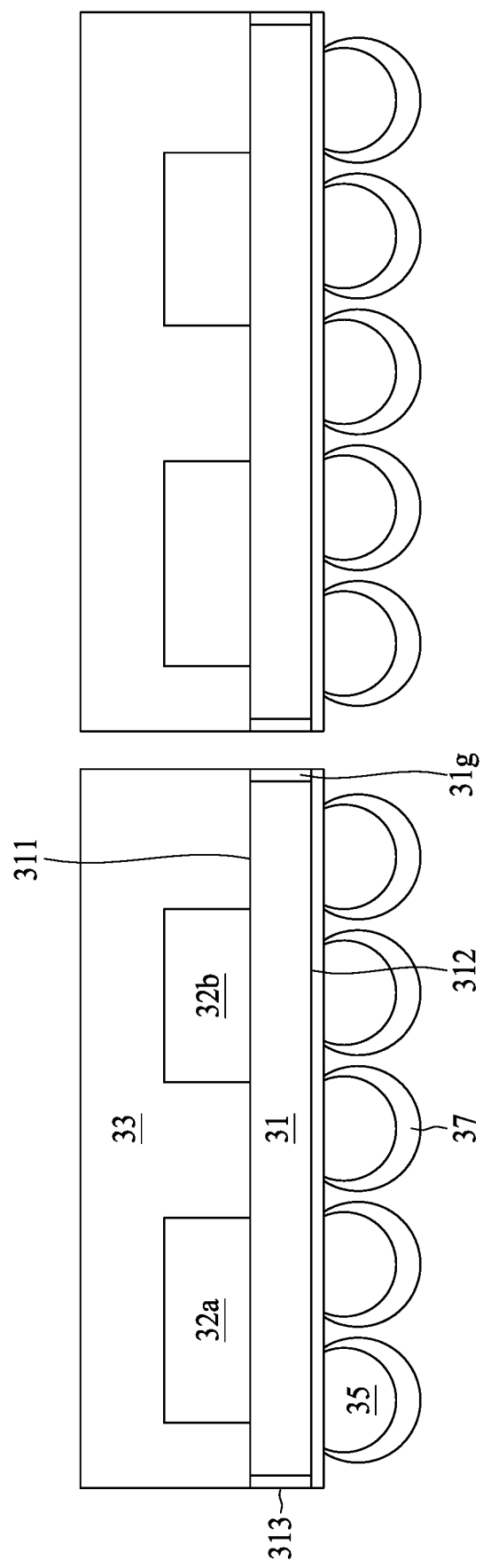

Referring to FIG. 3C, singulation is performed to separate out individual semiconductor package devices. That is, the singulation is performed through the package body 33 and the substrate strip including the substrates 31. The singulation may be performed, for example, by using a dicing saw, laser or other appropriate cutting technique. As depicted in FIG. 3C, a side surface of the insulating film 37 is aligned with a lateral surface 313 of each substrate 31.

Figure 3D:
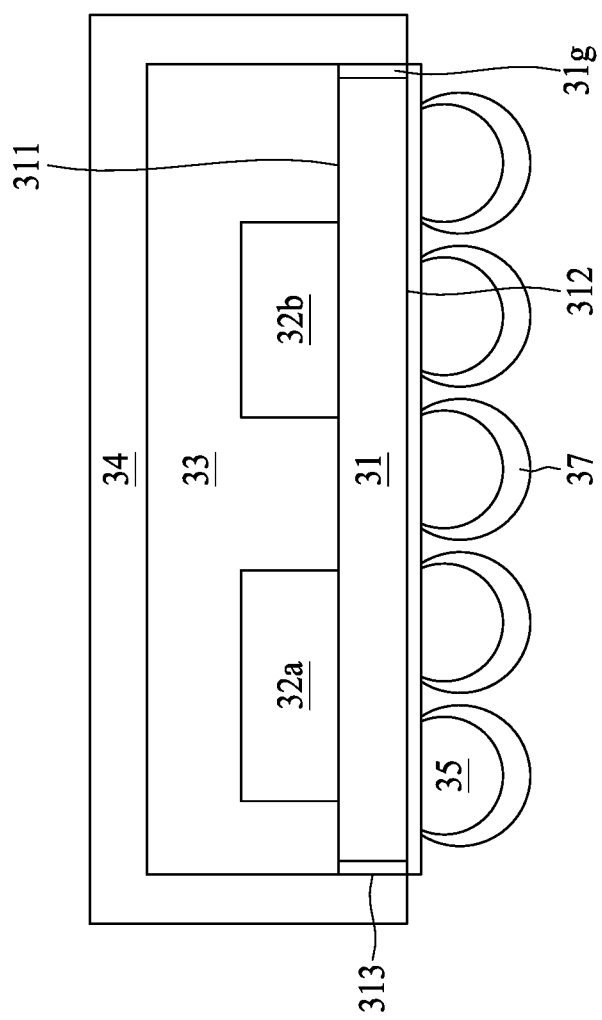

Referring to FIG. 3D, a shielding layer 34 is formed to cover an external surface of the package body 33 and the lateral surface 313 of the substrate 31. The shielding layer 34 directly contacts and is electrically connected to the grounding element 31g of the substrate 31. In some embodiments, the shielding layer 34 is a conformal shield. The shielding layer 34 is aligned with the bottom surface 312 of the substrate 31. In some embodiments, the shielding layer 34 can be formed by sputtering or other appropriate deposition technique. In some embodiments, the shielding layer 34 is a conductive thin film, and may include, for example, Al, Cu, Cr, Sn, Au, Ag, Ni or stainless steel, or a mixture, an alloy, or other combination thereof.

The shielding layer 34 may include a single conductive layer or multiple conductive layers. In some embodiments, the shielding layer 34 includes multiple conductive layers, and the multiple conductive layers may include a same material, or ones of the multiple conductive layers may include different materials, or each of the multiple conductive layers may include different materials from others of the multiple conductive layers. In some embodiments, each conductive layer of the shielding layer 34 has a thickness of up to about 200 μm, such as up to about 150 μm, up to about 100 μm, up to about 50 μm, up to about 10 μm, up to about 5 μm, up to about 1 μm, or up to about 500 nm, and down to about 100 nm or less, down to about 50 nm or less, or down to about 10 nm or less. In some embodiments, the shielding layer 34 includes multiple conductive layers, and different conductive layers may have different thicknesses.

Figure 3E:
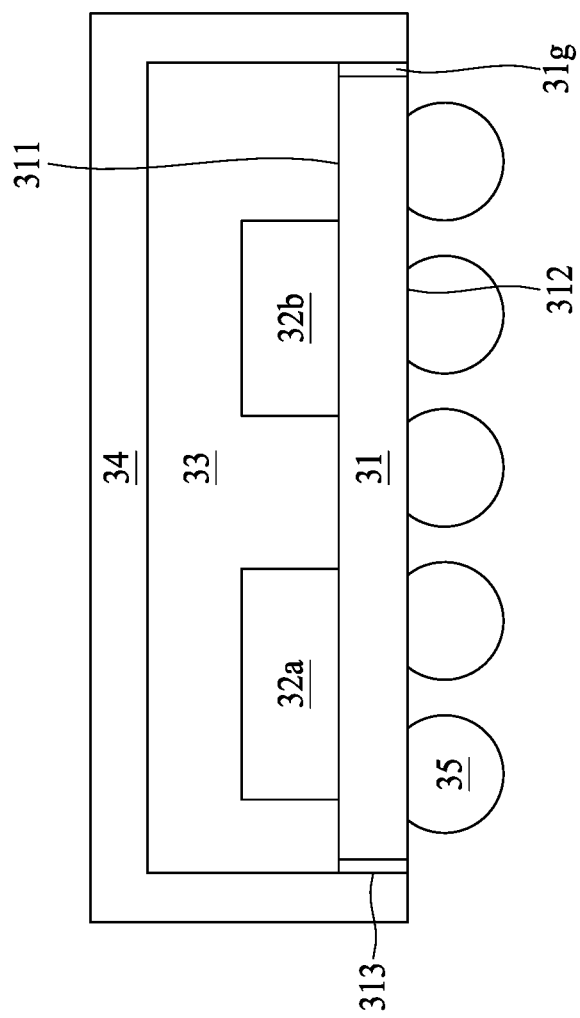

Referring to FIG. 3E, the insulating film 37 is removed from the bottom surface 312 of the substrate 31 and the interconnection elements 35 to form a semiconductor package device 3. In some embodiments, the insulating film 37 can be removed by the following operations: (a) dipping the insulating film 37 in a chemical bath of a liquid, such as sodium hydroxide (NaOH); and (b) removing the insulating film 37 by using a water jet. In other embodiments, a portion of the insulating film 37 remains on the bottom surface 312 of the substrate 31 to form the semiconductor package device 1 depicted in FIG. 1. In some embodiments, a solder mask layer (not shown in FIGS. 3A-3E) is formed on the bottom surface 312 of the substrate 31 prior to forming the insulating film 37, and the insulating film 37 is formed on the solder mask layer.

In the absence of an insulating film which is formed to cover interconnection elements before forming a shielding layer, when sputtering a metal to form the shielding layer, the shielding layer is likely to be electrically connected to the interconnection elements to cause an undesired short circuit. As shown in FIGS. 3A-3E, by forming the insulating film 37 to cover the interconnection elements 35 before forming the shielding layer 34, the insulating film 37 can prevent an undesired short circuit between the interconnection elements 35 and the shielding layer 34, which can, in turn, increase a reliability of the semiconductor package device 3 and reduce a manufacturing cost.

FIGS. 4A-4D illustrate a semiconductor manufacturing method in accordance with some embodiments of the present disclosure. The operations shown in FIGS. 4A-4D are performed subsequent to the operations of forming the interconnection elements 35 shown in FIG. 3B.

Figure 4A:
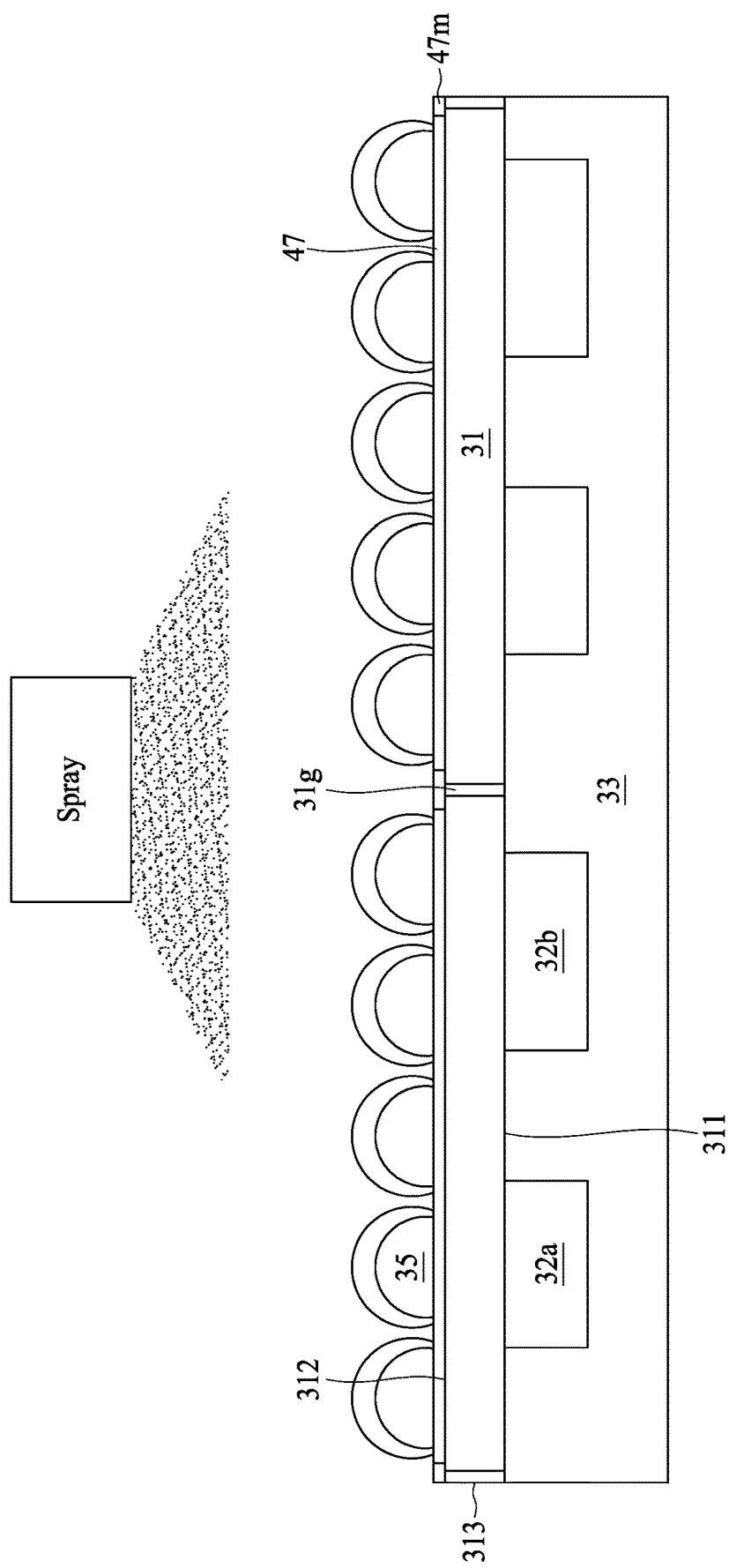
FIG. 4A, FIG. 4B, FIG. 4C and FIG. 4D illustrate a manufacturing method in accordance with some embodiments of the present disclosure.

Referring to FIG. 4A, after forming the interconnection elements 35, a mask frame 47m is disposed or formed on the bottom surfaces 312 of the substrates 31. An insulating film 47 may be formed on the bottom surface 312 of each substrate 31 by, for example, a spray coating technique. The insulating film 47 covers the bottom surface 312 of the substrate 31 that is exposed by the mask frame 47m. The insulating film 47 covers the interconnection elements 35. The mask frame 47m is removed subsequent to the formation of the insulating film 47. In some embodiments, the insulating film 47 is formed by the following operations: (a) mixing a diluent and an insulating ink to form a material of the insulating film 47; (b) coating the material of the insulating film 47 on the interconnection elements 35 and the bottom surface 312 of the substrate 31 that is exposed by the mask frame 47m; and (c) curing the material to form the insulating film 47. In operation (b), the coating can be accomplished by spraying. In some embodiments, the insulating film 47 is selected from, or formed from, a thermal curing resin or an UV curing resin.

Figure 4B:
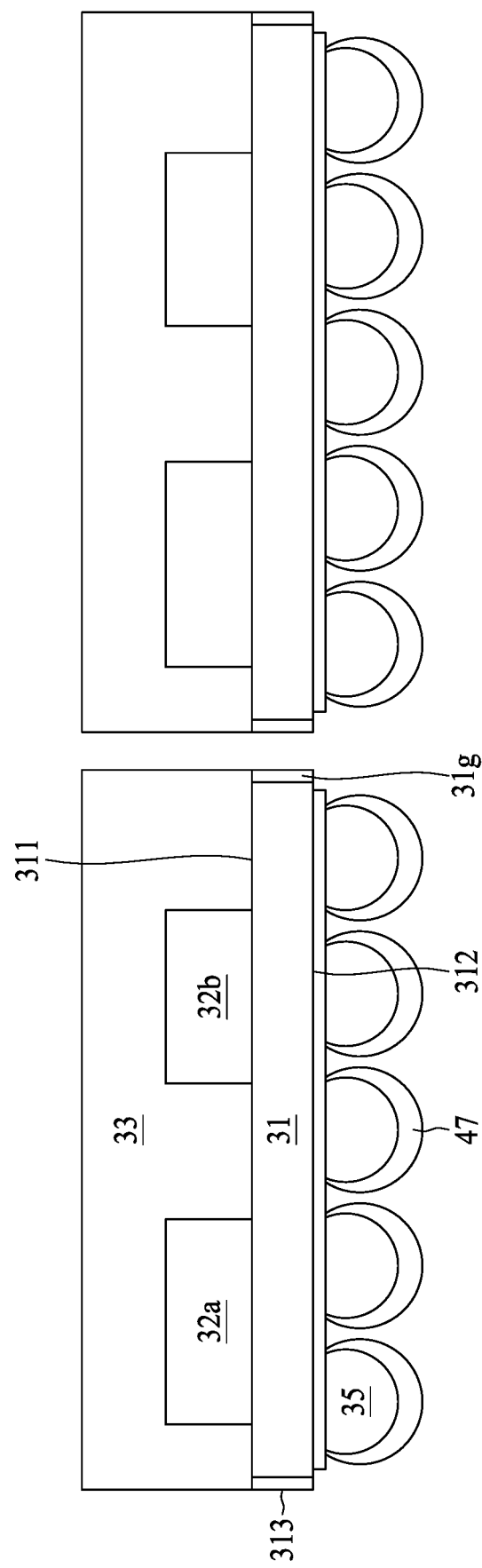

Referring to FIG. 4B, singulation may be performed to separate out individual semiconductor package devices. That is, the singulation is performed through the package body 33 and the substrate strip including the substrates 31. The singulation may be performed, for example, by using a dicing saw, laser or other appropriate cutting technique. As depicted in FIG. 4B, a side surface of the insulating film 47 is not aligned with the lateral surface 313 of the substrate 31, and a space is formed between the side surface of the insulating film 47 and the lateral surface 313 of the substrate 31 after removing the mask frame 47m.

Figure 4C:
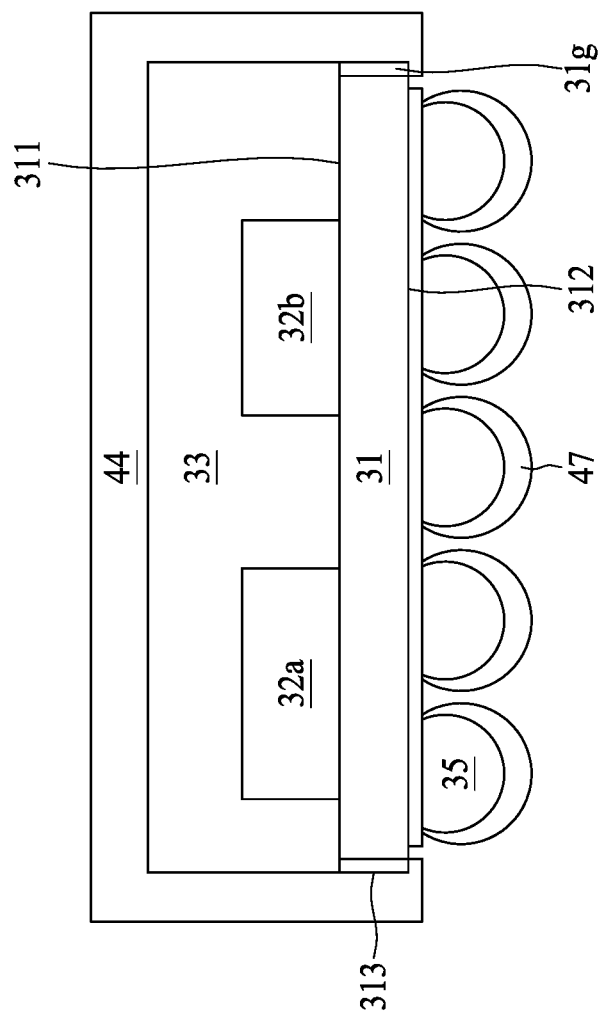

Referring to FIG. 4C, a shielding layer 44 is formed to cover the external surface of the package body 33, the lateral surface 313 of the substrate 31 and a portion of the bottom surface 312 of the substrate 31. The shielding layer 44 is electrically isolated from the interconnection elements 35 by the insulating film 47. The shielding layer 44 directly contacts and is electrically connected to the grounding element 31g of the substrate 31. In some embodiments, the shielding layer 44 is a conformal shield. In some embodiments, the shielding layer 44 can be formed by sputtering or other appropriate deposition technique. In some embodiments, the shielding layer 44 is a conductive thin film, and may include, for example, Al, Cu, Cr, Sn, Au, Ag, Ni or stainless steel, or a mixture, an alloy, or other combination thereof.

The shielding layer 44 may include a single conductive layer or multiple conductive layers. In some embodiments, the shielding layer 44 includes multiple conductive layers, and the multiple conductive layers may include a same material, or ones of the multiple conductive layers may include different materials, or each of the multiple conductive layers may include different materials from others of the multiple conductive layers. In some embodiments, each conductive layer of the shielding layer 44 has a thickness of up to about 200 μm, such as up to about 150 μm, up to about 100 μm, up to about 50 μm, up to about 10 μm, up to about 5 μm, up to about 1 μm, or up to about 500 nm, and down to about 100 nm or less, down to about 50 nm or less, or down to about 10 nm or less. In some embodiments, the shielding layer 44 includes multiple conductive layers, and different conductive layers may have different thicknesses.

Figure 4D:
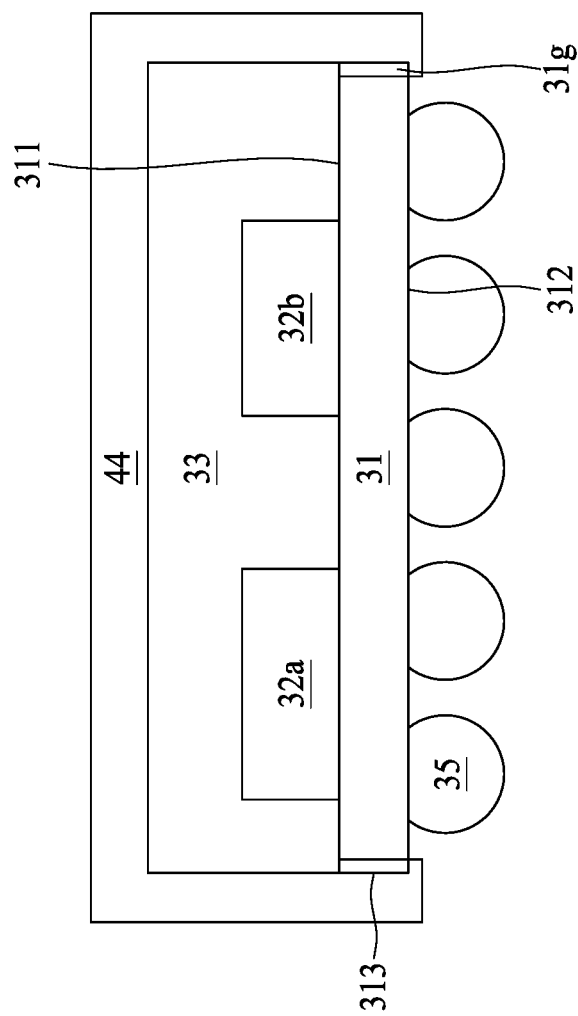

Referring to FIG. 4D, the insulating film 47 is removed from the bottom surface 312 of the substrate 31 and the interconnection elements 35 to form a semiconductor package device 4. In some embodiments, the insulating film 47 can be removed by the following operations: (a) dipping the insulating film 47 in a chemical bath of a liquid, such as NaOH; and (b) removing the insulating film 47 by using a water jet. In other embodiments, a portion of the insulating film 47 remains on the bottom surface 312 of the substrate 31 to form the semiconductor package device 2 depicted in FIG. 2. In some embodiments, a solder mask layer (not shown in FIGS. 4A-4D) is formed on the bottom surface 312 of the substrate 31 prior to forming the insulating film 47, and the insulating film 47 is formed on the solder mask layer.

As mentioned above, by forming the insulating film 47 to cover the interconnection elements 35 before forming the shielding layer 44, the insulating film 47 can prevent an undesired short circuit between the interconnection elements 35 and the shielding layer 44, which can, in turn, increase the reliability of the semiconductor package device 4 and reduce a manufacturing cost.

FIGS. 5A-5D illustrate a semiconductor manufacturing method in accordance with some embodiments of the present disclosure. The operations shown in FIGS. 5A-5D are performed subsequent to the operations of forming the interconnection elements 35 shown in FIG. 3B.

Figure 5A:
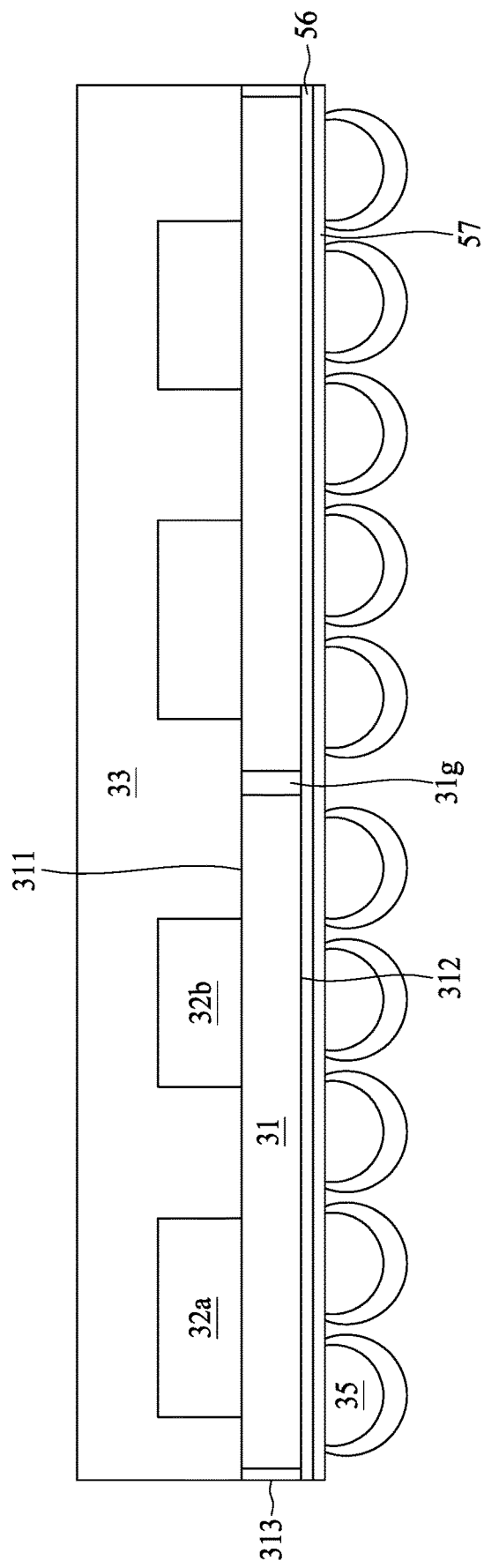
FIG. 5A, FIG. 5B, FIG. 5C and FIG. 5D illustrate a manufacturing method in accordance with some embodiments of the present disclosure.

Referring to FIG. 5A, after forming the interconnection elements 35, a first insulating film 56 is disposed or formed on the bottom surface 312 of each substrate 31 to cover the bottom surface 312 of the substrate 31 and a portion of the interconnection elements 35. In some embodiments, the first insulating film 56 is formed by the following operations: (a) mixing a diluent and an insulating ink to form a material of the first insulating film 56; (b) coating the material of the first insulating film 56 on the bottom surface 312 of the substrate 31 and a portion of the interconnection elements 35; and (c) curing the material to form the first insulating film 56. In operation (b), the coating can be accomplished by spraying. In some embodiments, the first insulating film 56 is selected from, or formed from, a thermal curing resin or an UV curing resin. In some embodiments, the first insulating film 56 is disposed on the bottom surface 312 of the substrate 31 by attaching the first insulating film 56 having holes on the bottom surface 312 of the substrate 31 to expose a portion of the interconnection elements 35 through the holes.

A second insulating film 57 is formed on the first insulating film 56 to cover the first insulating film 56 and a remaining portion of the interconnection elements 35 that is exposed from the first insulating film 56. In some embodiments, the second insulating film 57 is formed by the following operations: (a) mixing a diluent and an insulating ink to form a material of the second insulating film 57; (b) coating the material of the second insulating film 57 on the bottom surface 312 of the substrate 31 and the remaining portion of the interconnection elements 35; and (c) curing the second insulating film 57. In operation (b), the coating can be accomplished by spraying. In some embodiments, the second insulating film 57 is selected from, or formed from, a thermal curing resin or an UV curing resin. In some embodiments, the first insulating film 56 and the second insulating film 57 are formed of a same material. Alternatively, the first insulating film 56 and the second insulating film 57 are formed of different materials.

Figure 5B:
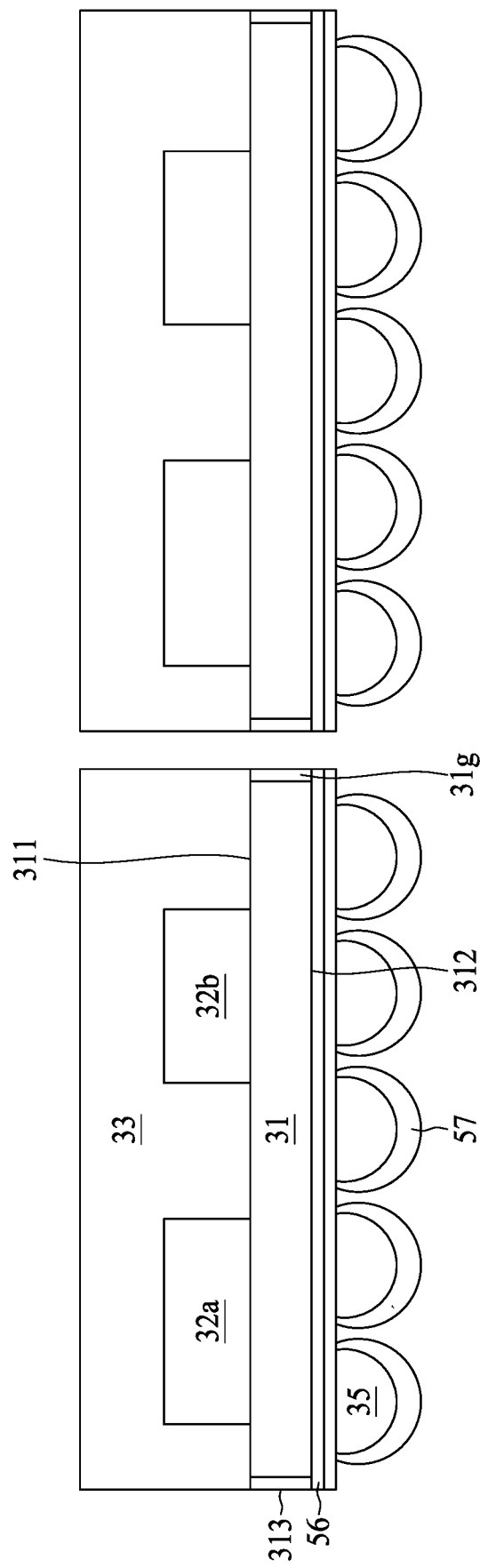

Referring to FIG. 5B, singulation may be performed to separate out individual semiconductor package devices. That is, the singulation is performed through the package body 33 and the substrate strip including the substrates 31. The singulation may be performed, for example, by using a dicing saw, laser or other appropriate cutting technique. As depicted in FIG. 5B, a side surface of the first insulating film 56 is aligned with the lateral surface 313 of the substrate 31, and a side surface of the second insulating film 57 is aligned with the side surface of the first insulating film 56.

Figure 5C:
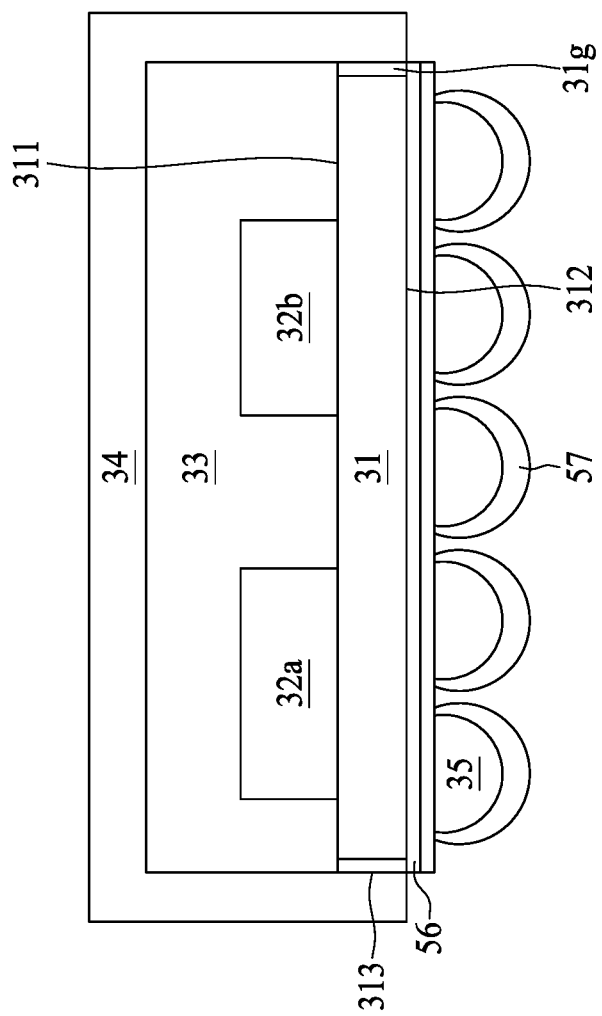

Referring to FIG. 5C, a shielding layer 34 is formed to cover the external surface of the package body 33 and the lateral surface 313 of the substrate 31. The shielding layer 34 directly contacts and is electrically to the grounding element 31g of the substrate 31. In some embodiments, the shielding layer 34 is a conformal shield. The shielding layer 34 is aligned with the bottom surface 312 of the substrate 31. In some embodiments, the shielding layer 34 can be formed by sputtering or other appropriate deposition technique. In some embodiments, the shielding layer 34 is a conductive thin film, and may include, for example, Al, Cu, Cr, Sn, Au, Ag, Ni or stainless steel, or a mixture, an alloy, or other combination thereof.

The shielding layer 34 may include a single conductive layer or multiple conductive layers. In embodiments, the shielding layer 34 includes multiple conductive layers, and the multiple conductive layers may include a same material, or ones of the multiple conductive layers may include different materials, or each of the multiple conductive layers may include different materials from others of the multiple conductive layers. In some embodiments, each conductive layer of the shielding layer 34 has a thickness of up to about 200 μm, such as up to about 150 μm, up to about 100 μm, up to about 50 μm, up to about 10 μm, up to about 5 μm, up to about 1 μm, or up to about 500 nm, and down to about 100 nm or less, down to about 50 nm or less, or down to about 10 nm or less. In some embodiments, the shielding layer 34 includes multiple conductive layers, and different conductive layers may have different thicknesses.

Figure 5D:
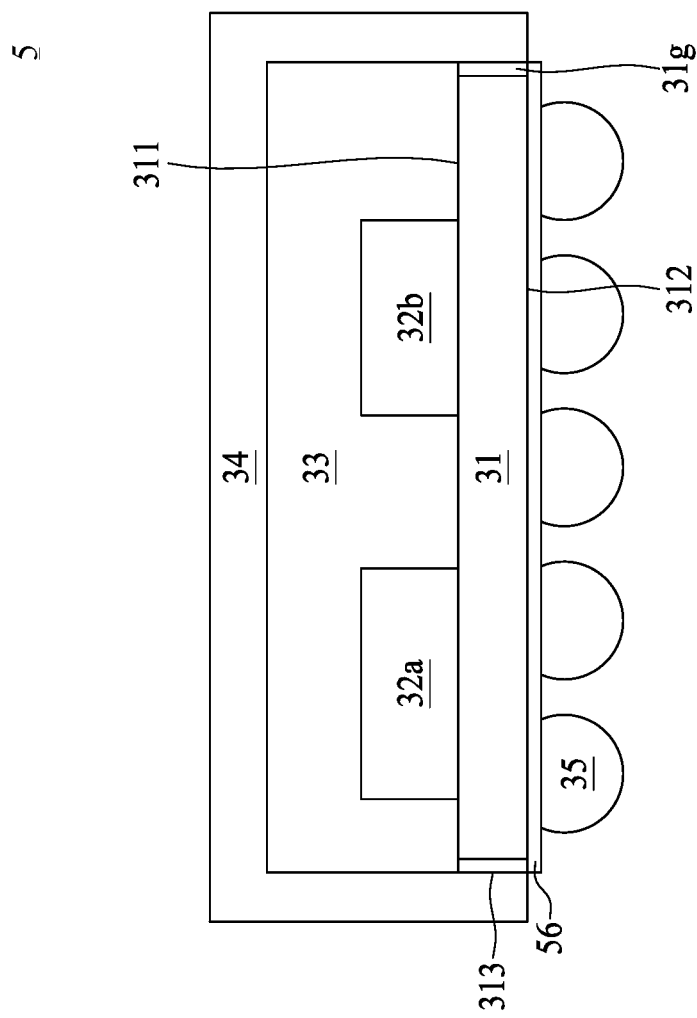

Referring to FIG. 5D, the second insulating film 57 is removed from the interconnection elements 35 to form a semiconductor package device 5 similar to the semiconductor package device 1 as shown in FIG. 1. In some embodiments, a portion of the first insulating film 56 covering the interconnection elements 35 is also removed from the interconnection elements 35. In some embodiments, the second insulating film 57 can be removed by the following operations: (a) dipping the second insulating film 57 in a chemical bath of a liquid, such as NaOH; and (b) removing the second insulating film 57 by using a water jet. In some embodiments, a portion of the first insulating film 56 covering the interconnection elements 35 can be removed in conjunction or sequentially with the second insulating film 57 by similar operations. In some embodiments, a solder mask layer (not shown in FIGS. 5A-5D) is formed on the bottom surface 312 of the substrate 31 prior to forming the first insulating film 56, and the first insulating film 56 is formed on the solder mask layer. In some embodiments, an adhesiveness of the first insulating film 56 is greater than that of the second insulating film 57, such that the second insulating film 57 can be removed while retaining the first insulating film 56 on the bottom surface 312 of the substrate 31.

As mentioned above, by forming the first insulating film 56 and the second insulating film 57 to cover the interconnection elements 35 before forming the shielding layer 34, the first insulating film 56 and the second insulating film 57 can prevent an undesired short circuit between the interconnection elements 35 and the shielding layer 34, which can, in turn, increase the reliability of the semiconductor package device and reduce a manufacturing cost.

Figure 6A:
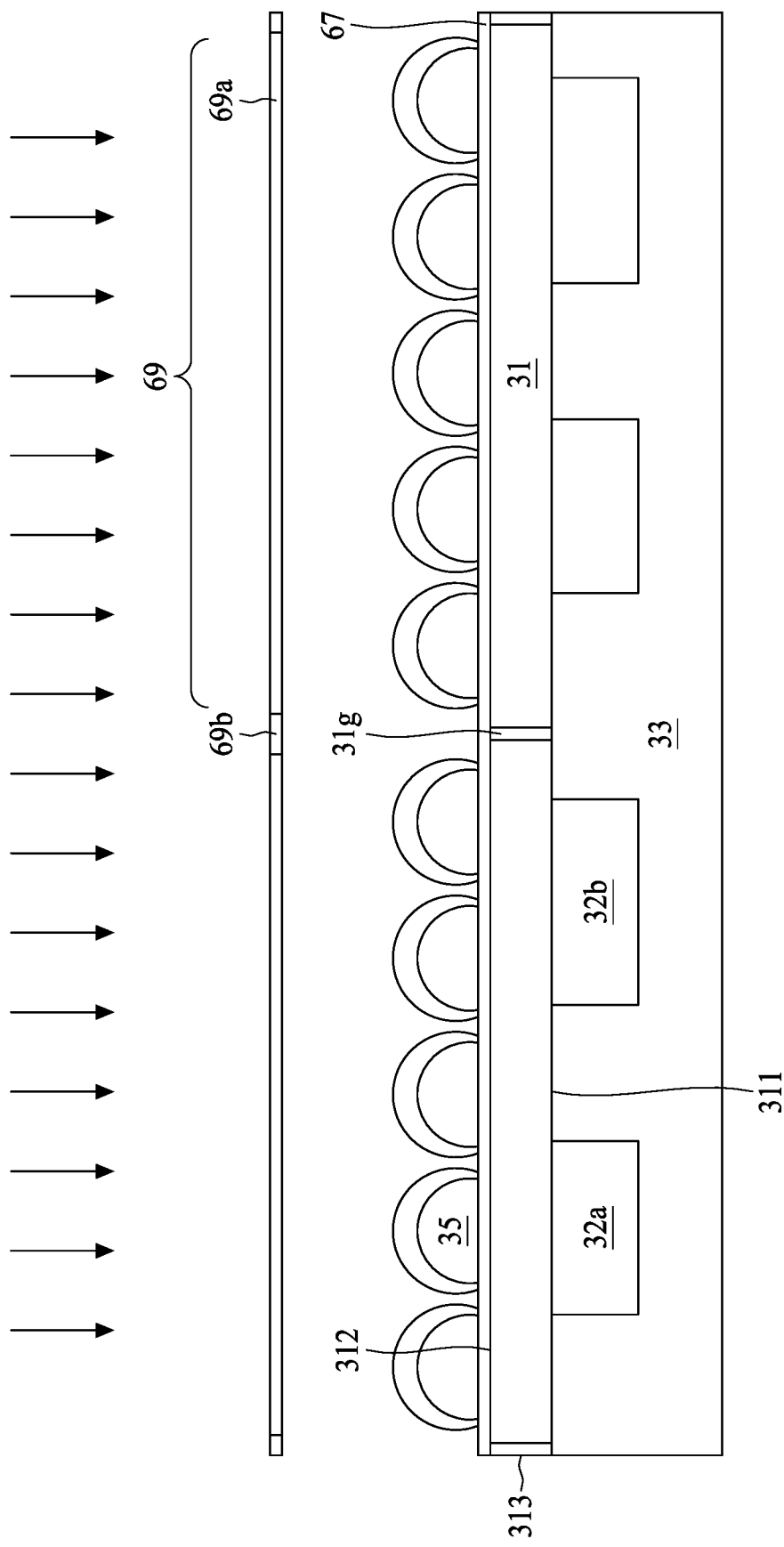
FIG. 6A and FIG. 6B illustrate a manufacturing method in accordance with some embodiments of the present disclosure.
Figure 6B:
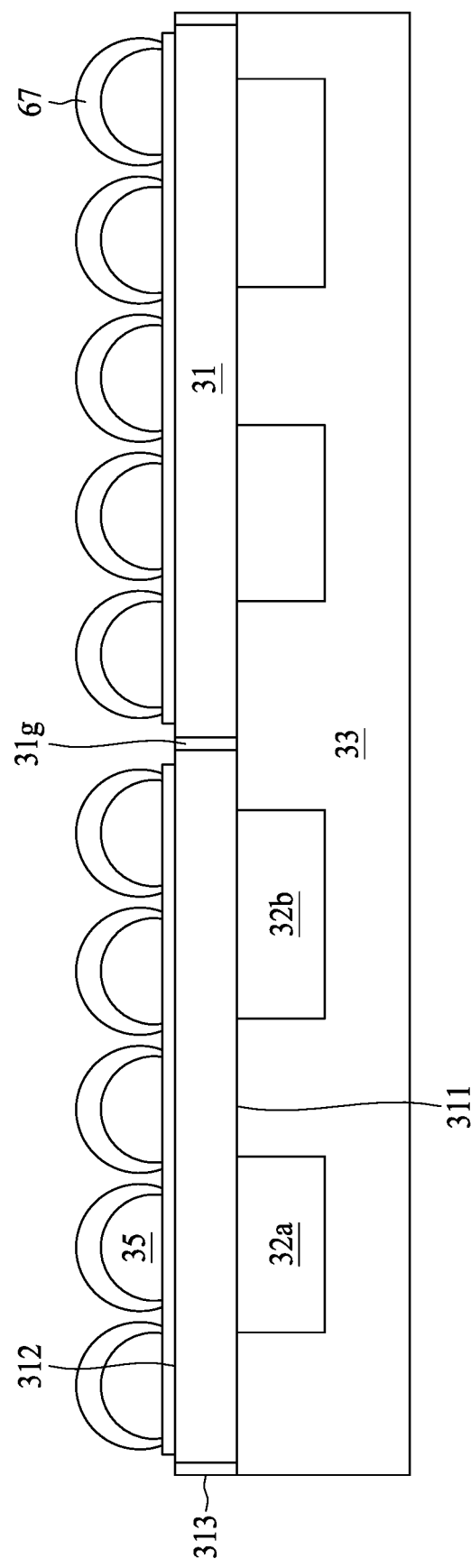

FIGS. 6A and 6B illustrate a semiconductor manufacturing method in accordance with some embodiments of the present disclosure. The operations shown in FIGS. 6A and 6B are additional embodiments of forming the insulating film 47 as shown in FIG. 4A. That is, the operations shown in FIGS. 6A and 6B are performed subsequent to the operations of forming the interconnection elements 35 shown in FIG. 3B and prior to the operations of singulation shown in FIG. 4B.

Referring to FIG. 6A, after forming the interconnection elements 35, an insulating film 67 is formed to substantially fully cover the bottom surface 312 of each substrate 31 and the interconnection elements 35. The insulating film 67 may include, or may be formed from, an UV curing resin. A mask film 69 is disposed above the bottom surface 312 of the substrate 31. In some embodiments, the mask film 69 is a photo-imagable mask film. The mask film 69 is patterned to include at least two portions, which include a first portion 69a that is transmissive to UV light and a second portion 69b to block UV light. A photolithography technique is applied to the patterned mask film 69. After the operation of the photolithography technique, a portion of the insulating film 67 that is under the second portion 69b of the mask film 69 and not radiated by UV light is removed, to form the insulating film 67 as shown in FIG. 6B.

As shown in FIG. 6B, a side surface of the insulating film 67 is not aligned with the lateral surface 313 of the substrate 31. A space is formed between the side surface of the insulating film 67 and the lateral surface 313 of the substrate 31.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers (μm) of lying along a same plane, such as within 100 μm, within 80 μm, within 60 μm, within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A method of manufacturing a semiconductor package device, comprising:
   providing a substrate comprising a grounding element;
   disposing a die on a top surface of the substrate;
   forming a package body on the top surface of the substrate to cover the die;
   forming an interconnection element on a bottom surface of the substrate;
   forming an insulating film on the bottom surface of the substrate and the interconnection element, wherein the insulating film covers the interconnection element and is conformal to the interconnection element;
   forming a shielding layer on an external surface of the package body and a lateral surface of the substrate, wherein the shielding layer is connected to the grounding element; and
   removing at least a portion of the insulating film such that a portion of the interconnection element is exposed, from the insulating film, to an outside of the semiconductor package device.

2. The method of claim 1, wherein forming the insulating film comprises:
   coating a material of the insulating film on the bottom surface of the substrate and the interconnection element; and
   curing the material to form the insulating film.

3. The method of claim 1, wherein removing the insulating film comprises:
   dipping the insulating film in a liquid; and
   removing the insulating film by using a water jet.

4. The method of claim 1, wherein a side surface of the insulating film is aligned with the lateral surface of substrate.

5. The method of claim 1, wherein a side surface of the insulating film and the lateral surface of the substrate are separated by a distance, and forming the shielding layer comprises forming a portion of the shielding layer on the bottom surface of the substrate.

6. The method of claim 1, wherein the grounding element is a via or a metal layer exposed from the lateral surface of the substrate.

7. The method of claim 1, wherein removing the insulating film comprises removing a portion of the insulating film covering the interconnection element, while another portion of the insulating film remains on the bottom surface of the substrate.

8. A method of manufacturing a semiconductor package device, comprising:
   providing a substrate comprising a grounding element;
   disposing a die on a top surface of the substrate;
   forming a package body on the top surface of the substrate to cover the die;
   forming an interconnection element on a bottom surface of the substrate;
   disposing a first insulating film on the bottom surface of the substrate, wherein the first insulating film covers a first portion of the interconnection element and exposes a second portion of the interconnection element to an outside of the semiconductor package device;
   forming a second insulating film on the first insulating film and the second portion of the interconnection element, wherein the second insulating film is conformal to the interconnection element;
   forming a shielding layer on an external surface of the package body and a lateral surface of the substrate, wherein the shielding layer is connected to the grounding element; and
   removing the second insulating film.

9. The method of claim 8, wherein disposing the first insulating film comprises attaching the first insulating film having a hole on the bottom surface of the substrate to expose the second portion of the interconnection element through the hole.

10. The method of claim 8, wherein forming the second insulating film comprises:
    coating a material of the second insulating film on the first insulating film and the second portion of the interconnection element; and
    curing the material to form the second insulating film.

11. The method of claim 10, wherein the material of the second insulating film is selected from a thermal curing resin or an UV curing resin, and curing the material comprises performing thermal curing or UV curing.

12. The method of claim 8, wherein removing the second insulating film comprises:
 dipping the second insulating film in a liquid; and
 removing the second insulating film by using a water jet.

\* \* \* \* \*